United States Patent
Ohnishi et al.

(10) Patent No.: US 8,220,692 B2
(45) Date of Patent: Jul. 17, 2012

(54) LEAD-FREE SOLDER

(75) Inventors: Tsukasa Ohnishi, Tokyo (JP); Toshihiko Taguchi, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 12/736,624

(22) PCT Filed: Apr. 21, 2009

(86) PCT No.: PCT/JP2009/057910
§ 371 (c)(1), (2), (4) Date: Nov. 29, 2010

(87) PCT Pub. No.: WO2009/131114
PCT Pub. Date: Oct. 29, 2009

(65) Prior Publication Data
US 2011/0089224 A1    Apr. 21, 2011

(30) Foreign Application Priority Data
Apr. 23, 2008    (JP) ................................ 2008-112007

(51) Int. Cl.
*B23K 35/00* (2006.01)
*B23K 35/22* (2006.01)

(52) U.S. Cl. ................ 228/56.3; 420/561; 420/562
(58) Field of Classification Search ............... 228/56.3; 420/561, 562
See application file for complete search history.

(56) References Cited

U.S. PATENT DOCUMENTS
6,365,097 B1 *   4/2002   Yamashita et al. ............ 420/561

FOREIGN PATENT DOCUMENTS

| | | |
|---|---|---|
| EP | 1897649 | 3/2008 |
| GB | 2421030 | 6/2006 |
| JP | 10225790 | 8/1998 |
| JP | 200257177 | 2/2002 |
| JP | 200394195 | 4/2003 |
| JP | 200626745 | 2/2006 |
| JP | 2006212660 | 8/2006 |
| WO | 2007081775 | 7/2007 |

* cited by examiner

*Primary Examiner* — Jessica L Ward
*Assistant Examiner* — Erin Saad
(74) *Attorney, Agent, or Firm* — Michael Tobias

(57) ABSTRACT

An inexpensive lead-free solder which prevents the occurrence of tin pest at extremely low temperatures and which has good wettability and impact resistance has a composition consisting essentially of, in mass %, Cu: 0.5-0.8%, Bi: at least 0.1% and less than 1%, Ni: 0.02-0.04%, and a remainder of Sn.

5 Claims, 1 Drawing Sheet

LEAD-FREE SOLDER

TECHNICAL FIELD

This invention relates to a Sn—Cu based lead-free solder which does not cause tin pest even at extremely low temperatures such as −40° C. or below, which has excellent spreadability and impact resistance, and which is suitable for soldering of electronic equipment.

BACKGROUND ART

Pb—Sn solder has been used for bonding of metals from long in the past. Recently, Pb—Sn solder has been widely used for soldering of electronic equipment and particularly for soldering of electronic parts to printed circuit boards. Pb—Sn solder has a melting point of 183° C. at a eutectic composition (Pb-63Sn), and soldering can be carried out at a temperature of 240° C. or less, so it does not produce thermal effects on electronic parts or printed circuit boards. In addition, a Pb—Sn solder near this eutectic composition has the excellent properties that it has excellent wettability and does not cause soldering defects. Therefore, it has contributed to the reliability of electronic equipment.

However, as awareness of the environment has increased in recent years, restrictions on the use of lead have developed through RoHs regulations. As a result, the use of Pb—Sn solder, which contains lead, is being regulated, and so-called lead-free solder which does not contain lead is being increasingly used.

Lead-free solder is a solder alloy having Sn as a main component. Typical examples of lead-free solders which have been used in the past include Sn-3.5Ag (melting point of 220° C.), Sn-3Ag-0.5Cu (melting point of 217-220° C.), Sn-5Sb (melting point of 240° C.), Sn-9Zn (melting point of 199° C.), and Sn-0.7Cu (melting point of 227° C.). Each of these lead-free solders has a Sn content which is quite high compared to that of a Pb—Sn solder.

Among these lead-free solders, Sn-3.5Ag and Sn-3Ag-0.5Cu have superior solderability compared to other lead-free solders. However, they contain a large amount of expensive Ag, so they are not so suitable for soldering in fields where there is intense price competition.

Sn-5Sb uses inexpensive raw materials, but due to its melting point which is high, its soldering temperature necessarily becomes high, and thermal effects on electronic parts and printed circuit boards become a problem. Therefore, its uses are extremely limited.

Sn-9Zn has a melting point of 199° C., which is close to that of a conventional Pb—Sn eutectic solder. Therefore, it has no problems of thermal effects on electronic parts or printed circuit boards. However, Sn-9Zn not only has poor wettability, but peeling of soldered joints when they are subjected to an external impact has been reported. This peeling is due to a large difference in the ionization tendency of the Zn in the solder and the Cu present in portions to be soldered. As a result, when moisture in the periphery of soldered joints condenses, electrochemical corrosion caused by a local cell action is produced, and it becomes easier for peeling of soldered joints to take place.

Because Sn-0.7Cu is inexpensive and it has a relatively high surface gloss, it is used by preference for plating of inexpensive parts to be soldered on printed circuit boards (such as connectors). However, its wettability is not sufficient for use in soldering of electronic equipment, so there is a need for an improvement in its wettability.

Below-identified Patent Document 1 proposes adding a small amount of P or P and Ge to Sn-0.7Cu to improve its wettability. The Sn—Cu based solder disclosed in that patent document may contain at least one element selected from Ag, Sb, Ni, Co, Fe, Mn, Cr, Mo, Bi, In, and Zn in order to improve its various properties. There is an example containing Bi in which 2 mass % of Bi is added.

Electronic equipment and particularly portable electronic equipment such as mobile phones, notebook computers, and cameras are used even in extremely cold regions at high latitudes. In such extremely cold regions, the temperature sometimes reaches an extremely low temperature such as −20° C. or below, and soldered joints in portable electronic equipment which is sometimes taken outside and used there is exposed to such extremely low temperatures. It has been reported that when lead-free solder is exposed to extremely low temperatures, it may become brittle and break. Furthermore, as portable electronic equipment is sometimes dropped and receives an impact, soldered joints in portable electronic equipment need to have good impact resistance.

Embrittlement of lead-free solder in extremely cold regions is generally caused by tin pest. Tin pest is a phenomenon in which white tin (β-Sn) which is a tetragonal crystal and which is soft and highly ductile at room temperature undergoes an allotropic transformation at low temperatures into a gray cubic crystal (α-Sn, gray tin) which has no ductility and is extremely brittle. This phenomenon has been known from long in the past. The transformation temperature from β-Sn to α-Sn is approximately 13° C. However, due to the effect of supercooling, tin pest does not actually develop until the temperature reaches −20° C. or below, and it becomes marked around −40° C. As the use of electronic equipment in extremely cold regions where the air temperature falls below −20° C. increases, a concern has developed of embrittlement and peeling of soldered joints caused by tin pest.

Below-identified Patent Document 2 proposes adding (1) Pb, (2) Pb+one or both of Bi and Ag, or (3) Bi+Ag in an amount of 150-900 ppm (=0.015-0.09%) in order to prevent the occurrence of tin pest in a solder alloy having tin as a main component. The type of solder alloy can be any of various compositions such as Sn—Cu based alloys, Sn—Ag—Cu based alloys, Sn—Sb—Ag based alloys, and Sn—Zn—Bi based alloys.

Although not intended to suppress the occurrence of tin pest, Patent Document 3 proposes a lead-free solder consisting essentially of, in mass %, 0.1-5.0% of Bi, 0.1-5.0% of Ag, 0.1-3.0% of Sb, 0.1-5.0% of Cu, 0.001-0.01% of P, 0.01-0.1% of Ge, and a remainder of Sn, and Patent Document 4 proposes a Sn—Cu—Ni alloy which contains, in mass %, 0.01-0.5% of Ni, greater than 2% and at most 5% of Cu, and optionally at least one element selected from Ag, In, Zn, Sb, Bi, Ge, and P in an amount of at least 0.01%. In the examples in these patent documents, Bi is added in a large amount of at least 3 mass %.

Patent Document 1: JP 2003-94195 A
Patent Document 2: JP 2006-212660 A
Patent Document 3: JP H10-225790 A
Patent Document 4: JP 2006-26745 A

SUMMARY OF INVENTION

Because a Sn—Cu based lead-free solder is inexpensive, it is effective for decreasing the manufacturing costs of the above-described portable electronic equipment. However, a Sn—Cu based lead-free solder has the problem that it easily develops tin pest so that soldered joints formed therefrom easily peel off in extremely cold regions. As stated above, lead-free solder has a high Sn content compared to Pb—Sn solder, and it more easily develops tin pest. In particular, a Sn—Cu based lead-free solder which is typified by Sn-0.7Cu has an extremely high Sn content, and it is thought to most easily develop tin pest. Accordingly, it is extremely important to prevent the occurrence of tin pest in a Sn—Cu based lead-free solder.

In addition, because a Sn—Cu based lead-free solder does not have sufficient wettability with respect to portions to be soldered, it sometimes produces soldering defects.

The lead-free solder disclosed in Patent Document 4 contains a large amount of Cu (in excess of 2 mass %) in order to suppress Cu conductors present in portions to be soldered from dissolving into solder. Therefore, the melting temperature of this solder is high, and its uses are limited.

The object of the present invention is to provide a Sn—Cu based lead-free solder which does not become brittle due to tin pest even in extremely cold regions and which is improved with respect to wettability and impact resistance.

The present inventors found that tin pest of Sn—Cu based solder alloys having a low Cu content and a high Sn content typified by Sn-0.7Cu is effectively prevented by the addition of a small amount of Bi in the range of at least 0.1 mass % and less than 1 mass %. However, since Bi in itself is a brittle metal, a lead-free solder to which Bi is added has the problem that it is somewhat inferior with respect to impact resistance compared to the same solder not containing Bi. It was found that the addition of a minute amount of Ni not only makes it possible to completely prevent this deterioration in impact resistance but also makes it possible to increase impact resistance. Namely, by adding a small amount of Bi together with a minute amount of Ni, prevention of tin pest and improvement in impact resistance which are mutually opposing properties can be achieved in a low-Cu, high-Sn Sn—Cu based solder alloy. This lead-free solder also has good spreadability (wettability), and it does not readily develop soldering defects.

The present invention is a lead-free solder consisting essentially of, in mass %, Cu: at least 0.5% and at most 0.8%, Bi: at least 0.1% and less than 1%, Ni: at least 0.02% and at most 0.04%, and a remainder of Sn.

In a lead-free solder according to the present invention, the Bi content is preferably at least 0.1 mass % and at most 0.5 mass %.

A lead-free solder according to the present invention does not cause tin pest even at an extremely low temperature such as −40° C., so it does not cause soldered joints to break to pieces in cold regions. Moreover, the addition of a minute amount of Ni prevents a decrease in impact resistance due to the addition of Bi, and in addition, an improvement in wettability compared to a Sn—Cu solder not containing Bi is achieved. Accordingly, the present invention makes it possible to inexpensively produce soldered joints which prevent soldering defects, which have excellent impact resistance, which do not suffer from tin pest, and which have high reliability.

EMBODIMENTS OF THE INVENTION

Figure 1:
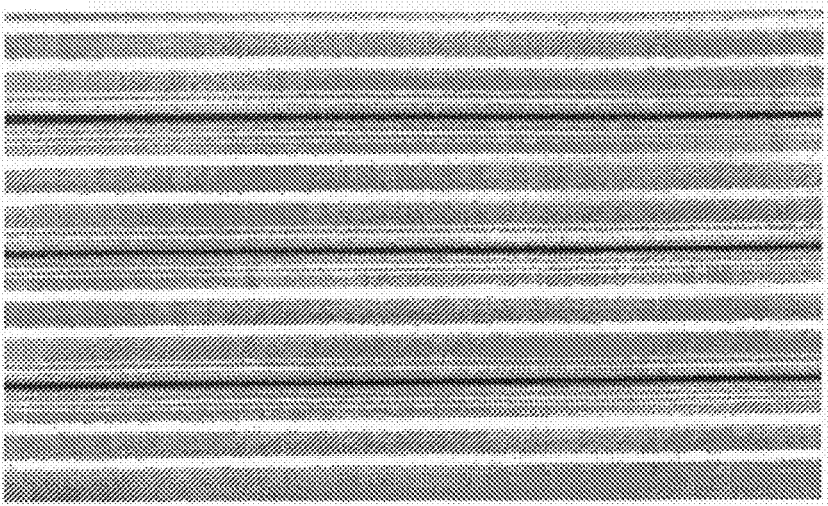
FIG. 1 is a photograph of a plurality of bar solder testing samples arranged side-by-side which did not develop tin pest in an extremely low temperature exposure test.

Below, the present invention will be explained in greater detail. In the following explanation, % with respect to an alloy composition means mass % unless otherwise indicated.

A Sn—Cu based lead-free solder according to the present invention consists essentially of Cu: at least 0.5% to at most 0.8%, Bi: at least 0.1% and less than 1%, Ni: at least 0.02% and at most 0.04%, and a remainder of Sn. In spite of the Sn content which has a high value of at least 98% (more precisely at least 98.16%) and typically at least 99%, the solder does not develop tin pest, and it has good spreadability and impact resistance.

Cu has the effects of increasing impact resistance and lowering the solidus temperature. If the Cu content is less than 0.5%, these effects are not exhibited. On the other hand, if the Cu content exceeds 0.8%, the liquidus temperature of the solder becomes too high.

Bi is effective for not only preventing tin pest but also increasing the wettability of solder. If the Bi content is less than 0.1%, the effect of preventing the occurrence of tin pest and the effect of increasing the wettability of solder are exhibited only to a limited extent. On the other hand, if Bi is added in an amount of 1% or more, embrittlement caused by Bi becomes marked, and the impact resistance of solder decreases. Therefore, the Bi content is made at least 0.1% and less than 1%.

When it is necessary to more effectively suppress brittleness due to Bi, for example, when manufacturing solder preforms in the form of molded pellets, washers, or the like, the Bi content is preferably made at least 0.1% and at most 0.5% in order to prevent the edge portions of the preforms from chipping at the time of molding. The above-described effects of Bi can be adequately obtained even with the addition of such a small amount of Bi.

The addition of Ni provides an increase in impact resistance and resistance to heat cycles. These effects are not obtained if the Ni content is less than 0.02%. On the other hand, if Ni is added in excess of 0.04%, the liquidus temperature of the solder becomes too high and it becomes impossible to perform soldering at 250° C., which is a typical soldering temperature.

A solder according to the present invention is a lead-free solder. Namely, absolutely no lead is intentionally added to it. Even if the solder is unavoidably contaminated with lead coming from the raw metal materials constituting the alloy components, the lead content of the solder is typically less than 500 ppm, and if high purity materials are used, the lead content is less than 100 ppm.

This lead-free solder preferably contains only the above-described four elements (Sn, Cu, Bi, and Ni), but it is possible to add minute amounts of other elements in order to improve various properties of the solder. For example, according to Patent Document 1, wettability can be improved by adding 0.001-0.1% of P by itself or by adding this amount of P together with 0.001-0.1% of Ge.

When adding other elements, the total added amount thereof is at most 0.5%, preferably at most 0.3%, and more preferably at most 0.1%. The Sn content is preferably at least 99%.

There are no particular limitations on the form of a lead-free solder according to the present invention, and it may be in the form of a powder, ball, rod, wire, rosin-core solder, or a solder preform which is formed into the shape of a pellet, a washer, or the like.

This lead-free solder is suitable for use in soldering of electronic equipment and particularly for soldering of electronic parts to printed circuit boards, but it can also be used for other applications. Soldering of electronic equipment is often performed using the reflow method or the flow soldering method.

Electronic parts are parts which constitute electronic equipment. They include active parts (such as semiconductor elements and IC's), passive parts (such as resistors, capacitors, and inductors), and mechanism parts (such as switches, connectors, variable resistors, and keyboards). In the present invention, electronic equipment means equipment containing a printed circuit board having, an electronic part mounted thereon.

For example, soldering of electronic parts to printed circuit boards in televisions and DVD players can be carried out by the flow soldering method in which solder in bar or wire form is charged into a wave soldering tank and melted to form molten solder. Soldering of electronic parts such as BGA's and CSP's (which are incorporated into mobile phones or personal computers) to printed circuit boards can use minute solder balls to form bumps on electrodes. This is a type of reflow soldering. Soldering of surface mounted parts such as QFP's and SOP's to printed circuit boards can be carried out by the reflow soldering method using a solder paste which is prepared by mixing solder powder and a soldering flux.

A solder paste is formed by mixing solder powder and a soldering flux. Flux used in solder paste can be either a water soluble flux or a non-water soluble flux, but typically, it is a rosin flux which is a rosin-based non-water soluble flux containing a suitable activator, solvent, and thixotropic agent.

EXAMPLES

Lead-free solders having the compositions shown in Table 1 were used to carry out test on tin pest, impact resistance, and spreadability in the following manner. Each of the raw materials used to prepare the solder alloys had a Pb content of at most 300 ppm. In the table, the alloys of Test Nos. 1-3 had a composition according to the present invention. The test results are also shown in Table 1.

with a diameter of 8 mm and a length of 110 mm. This bar-shaped testing sample was left in a freezer at −40° C. for approximately 10,000 hours, after which it was removed from the freezer and its surface was visually observed.

Figure 2:
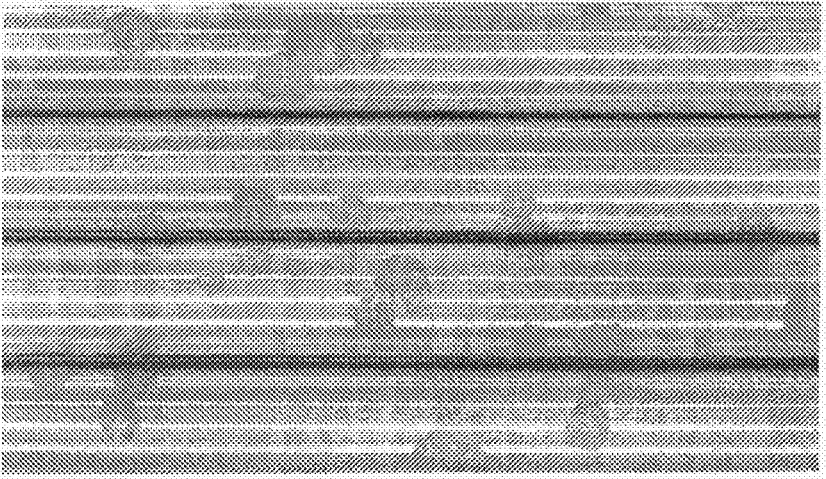
FIG. 2 is a photograph of a plurality of bar solder testing samples arranged side-by-side which developed tin pest in an extremely low temperature test.
Figure 3:
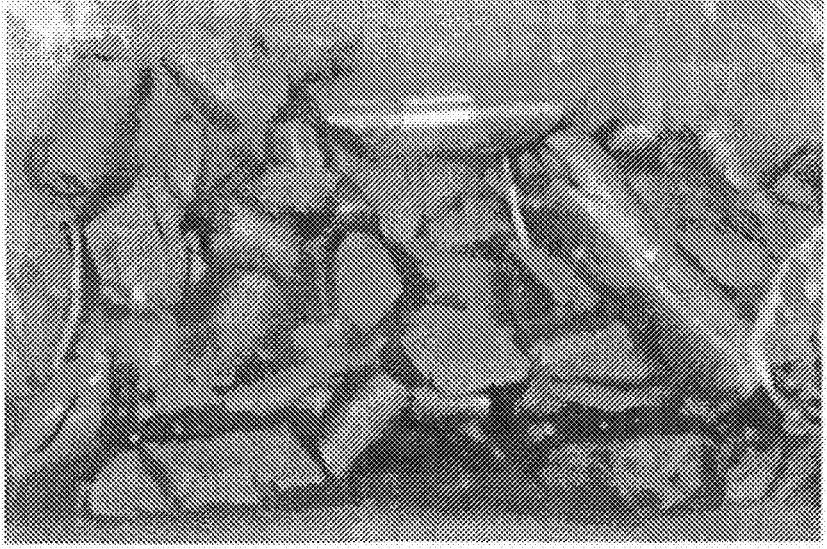
FIG. 3 is a photograph of bar solder testing samples which developed tin pest in an extremely low temperature test and spontaneously broke to pieces.

The surface of the bar-shaped testing sample was evaluated as ○ when there was no change at all compared to before placement in the freezer (the photograph in FIG. 1), it was evaluated as Δ when large spots appeared on the surface of the bar-shaped testing sample (the photograph in FIG. 2), and it was evaluated as X when it completely broke to pieces spontaneously (the photograph in FIG. 3). The spots which appeared on the surface of the bar-shaped testing sample were gray tin (α-Sn) formed by tin pest.

Impact Resistance Test (Dropping Test):

Impact resistance was evaluated by a dropping test carried out in accordance with standard JESD22-B111 of JEDEC.

Solder balls having a diameter of 0.3 mm were prepared from the lead-free solder of each composition using the oil bath ball-forming method. These solder balls were used to form solder bumps on a CSP substrate in a conventional manner (heating conditions: 220° C.×40 seconds, oxygen concentration of at most 100 ppm). The CSP substrate having solder bumps formed thereon was mounted on a printed circuit board by the reflow soldering method using a commercially available lead-free solder paste (solder alloy: Sn-3Ag-0.5Cu; flux: rosin type). The reflow heating conditions were 220° C.×45 seconds in an atmosphere of air.

The printed circuit board having a CSP substrate mounted thereon was installed on a base with the printed circuit board beneath the CSP substrate. The electrical resistance of the soldered joints between the CSP substrate and printed circuit board was measured and used as an initial value. The base was then allowed to freely fall from a height of 310 mm above a dropping position onto an epoxy resin table providing the dropping position to impart an impact. The electrical resistance of the soldered joints between the CSP substrate and the printed circuit board was measured.

An impact was repeatedly imparted by this dropping until the electrical resistance after dropping reached 120% of the initial electrical resistance before dropping, which indicated a conduction defect, and the number of times that dropping was performed up to this point was recorded. The case in which dropping was performed at least 40 times was evaluated as ○

TABLE 1

| Test No. | Alloy composition (mass %) | | | | | Tin pest | Impact resistance | Spreadability | Melting temperature (° C.) |
|---|---|---|---|---|---|---|---|---|---|
| | Sn | Cu | Ni | Bi | Other | | | | |
| 1 | rem | 0.5 | 0.02 | 0.1 | | ○ | ○ | ○ | 228-229 |
| 2 | rem | 0.5 | 0.02 | 0.5 | | ○ | ○ | ○ | 224-231 |
| 3 | rem | 0.8 | 0.04 | 0.9 | | ○ | ○ | ○ | 225-231 |
| 4 | rem | 0.7 | | | | X | ○ | X | 227-229 |
| 5 | rem | 0.5 | | | Ag: 3 | ○ | X | ○ | 217-219 |
| 6 | rem | | | | Sb: 5 | ○ | X | X | 240-243 |
| 7 | rem | | | | Zn: 9 | Δ | X | ○ | 198-214 |
| 8 | rem | | | 3 | Zn: 8.5 | ○ | X | X | 190-197 |
| 9 | rem | 0.6 | 0.05 | | Ge: 0.01 | X | ○ | ○ | 228-250 |
| 10 | rem | 0.5 | 0.02 | 1.5 | | ○ | X | ○ | 226-230 |

Tin Pest Test:

A lead-free solder of each composition was cast into an open casting mold (a boat-shaped mold) having a long side of 30 mm, a short side of 20 mm, and a length of 200 mm to obtain a rod-shaped casting. The outer periphery of the casting was cut with a lathe to obtain a bar solder testing sample (sufficient impact resistance), and the case in which dropping was performed less than 40 times was evaluated as X (insufficient impact resistance).

Solder Spreading Test:

The spreadability (wettability) of each lead-free solder was tested in accordance with JIS Z 3198-3 (lead-free solder testing method—spreading test method). The case in which the spreading factor was at least 70% was evaluated as ○, and the case in which it was less than 70% was evaluated as X.

Melting Temperature:

The melting temperature of each lead-free solder was measured in accordance with JIS Z 3198-1 (lead-free solder testing method—Section 1: melting temperature range testing method).

As can be seen from Table 1, when a conventional Sn—Cu based lead-free solder (the Sn-0.7Cu solder of Test No. 4) was left for a long period at an extremely low temperature of −40° C., it broke to pieces due to the occurrence of tin pest. In contrast, even when a lead-free solder according to the present invention (Test Nos. 1-3) was left for a long period at −40° C., there was no change whatsoever in its surface, and tin pest was completely prevented. In addition, as can be seen from the results of the spreading test, wettability was also superior to that of the conventional Sn—Cu based lead-free solder, and it also exhibited good impact resistance in a dropping test.

As shown by Test Nos. 5-6, 8, and 10, the object of preventing tin pest was also achieved by adding comparatively large amounts of Ag, Sb, or Bi. However, these added elements have an adverse effect on impact resistance, and the addition of Sb or 3% of Bi could not improve spreadability. In Test No. 9 in which a minute amount of Ge was added in place of Bi, tin pest could not be prevented, but impact resistance and spreadability were good. The lead-free solders of Test Nos. 7-8 which contained a large amount of Zn were both inferior with respect to impact resistance.

The invention claimed is:

1. A lead-free solder consisting of Cu: at least 0.5 mass % and at most 0.8 mass %, Bi: at least 0.1 mass % and less than 1 mass %, Ni: at least 0.02 mass % and at most 0.04 mass %, and a remainder of Sn.

2. A lead-free solder as claimed in claim 1 containing 0.1-0.5 mass % of Bi.

3. A lead-free solder as claimed in claim 1 containing at least 99 mass % of Sn.

4. A solder paste comprising a mixture of a lead-free solder as claimed in claim 1 and a soldering flux.

5. A soldering method comprising soldering an electronic part to a printed circuit board using a lead-free solder as claimed in claim 1.

* * * * *